US012787591B2

(12) United States Patent
Yang et al.

(10) Patent No.: US 12,787,591 B2
(45) Date of Patent: Nov. 3, 2026

(54) DISPLAY PANEL, DISPLAY DEVICE AND METHOD FOR PREPARING DISPLAY PANEL

(71) Applicants: YUNNAN INVENSIGHT OPTOELECTRONICS TECHNOLOGY CO., LTD., Kunming (CN); BOE TECHNOLOGY GROUP CO., LTD., Beijing (CN)

(72) Inventors: Chao Yang, Beijing (CN); Weiliang Bu, Beijing (CN); Kuanta Huang, Beijing (CN); Hongtao Yu, Beijing (CN); Dongdong Su, Beijing (CN); Zongshun Yang, Beijing (CN); Yunhao Zhang, Beijing (CN); Fushuang Zhang, Beijing (CN); Zhongxiang Yu, Beijing (CN)

(73) Assignees: Yunnan Invensight Optoelectronics Technology Co., Ltd., Kunming (CN); Beijing BOE Technology Development Co., Ltd., Beijing (CN)

( * ) Notice: Subject to any disclaimer, the term of this patent is extended or adjusted under 35 U.S.C. 154(b) by 518 days.

(21) Appl. No.: 18/272,655

(22) PCT Filed: Sep. 20, 2022

(86) PCT No.: PCT/CN2022/119867
§ 371 (c)(1),
(2) Date: Jul. 17, 2023

(87) PCT Pub. No.: WO2024/060008
PCT Pub. Date: Mar. 28, 2024

(65) Prior Publication Data
US 2024/0407221 A1 Dec. 5, 2024

(51) Int. Cl.
*H10K 59/38* (2023.01)
*H10K 59/80* (2023.01)

(52) U.S. Cl.
CPC ........... *H10K 59/38* (2023.02); *H10K 59/879* (2023.02)

(58) Field of Classification Search
CPC ............................ H10K 59/38; H10K 59/879
See application file for complete search history.

(56) References Cited

U.S. PATENT DOCUMENTS

| | | | | |
|---|---|---|---|---|
| 10,962,832 | B2 * | 3/2021 | Li | H10K 59/879 |
| 11,594,859 | B2 | 2/2023 | Mitomo et al. | |

(Continued)

FOREIGN PATENT DOCUMENTS

| | | | |
|---|---|---|---|
| CN | 103562777 | A | 2/2014 |
| CN | 108198844 | A | 6/2018 |

(Continued)

OTHER PUBLICATIONS

European Extended Search Report, Application No. 22959020.3, dated Dec. 6, 2024, 11 pps.
KR First Office Action, Application No. 1020247023310, dated Mar. 11, 2026, 18 pps.: with English translation.

*Primary Examiner* — Joseph L Williams
(74) *Attorney, Agent, or Firm* — Armstrong Teasdale LLP

(57) ABSTRACT

Embodiments of the present disclosure relate to a display panel, a display device, and a method for preparing a display panel. The display panel includes a substrate; a light-emitting functional layer disposed on the substrate; a filtering layer disposed on a side of the light-emitting functional layer away from the substrate and including a plurality of filtering units, wherein at least one of the plurality of filtering units is designed to allow at least a portion of light from the light-emitting functional layer to diverge; and a plurality of light-converging elements disposed on a side of (Continued)

the filtering layer away from the substrate and configured to allow light from the plurality of filtering units to converge.

17 Claims, 6 Drawing Sheets

(56) References Cited

U.S. PATENT DOCUMENTS

| | | | |
|---|---|---|---|
| 2014/0078274 A1 | 3/2014 | Kroon et al. | |
| 2015/0048333 A1 | 2/2015 | Choi et al. | |
| 2020/0111844 A1* | 4/2020 | Jing | G06F 3/0443 |
| 2020/0395575 A1 | 12/2020 | Maeda et al. | |
| 2021/0005688 A1 | 1/2021 | Shinya et al. | |
| 2021/0343793 A1 | 11/2021 | Weng et al. | |
| 2022/0199587 A1 | 6/2022 | Huang et al. | |
| 2022/0246697 A1 | 8/2022 | Wang et al. | |

FOREIGN PATENT DOCUMENTS

| | | | |
|---|---|---|---|
| CN | 108987435 | A | 12/2018 |
| CN | 109633946 | A | 4/2019 |
| CN | 109659346 | A | 4/2019 |
| CN | 110045539 | A | 7/2019 |
| CN | 110610956 | A | 12/2019 |
| CN | 110892597 | A | 3/2020 |
| CN | 111430444 | A | 7/2020 |
| CN | 111492271 | A | 8/2020 |
| CN | 111627345 | A | 9/2020 |
| CN | 111699756 | A | 9/2020 |
| CN | 111725418 | A | 9/2020 |
| CN | 212874495 | U | 4/2021 |
| CN | 113241354 | A | 8/2021 |
| EP | 4102270 | A1 | 12/2022 |
| WO | 2019159641 | A1 | 8/2019 |
| WO | 2021176882 | A1 | 9/2021 |

* cited by examiner

DISPLAY PANEL, DISPLAY DEVICE AND METHOD FOR PREPARING DISPLAY PANEL

CROSS-REFERENCES TO RELATED APPLICATIONS

This patent application is a National Stage Entry of PCT/CN2022/119867 filed on Sep. 20, 2022, the disclosure of which is incorporated by reference herein in its entirety as part of the present application.

FIELD

The present disclosure relates to the field of display technology and, in particular, to a display panel, a display device, and a method for preparing a display panel.

BACKGROUND

An Organic Light-Emitting Diode (OLED) display device, also known as an organic electroluminescent display device, is a different display device from the traditional liquid crystal display (LCD). Such display technology has the advantages of simple structure, self-luminescence, high contrast, thin thickness, wide viewing angle, fast response time, continuously adjustable luminous color, and being usable in a flexible panel, etc. Therefore, it has become one of the important development directions of a new generation of display devices, and has received more and more attention.

However, due to the manufacturing process and other reasons, the performance of OLED display devices still needs to be improved.

BRIEF DESCRIPTION

Embodiments of the present disclosure provide a display panel, a display device, and a method for preparing a display panel.

An aspect of the present disclosure provides a display panel. The display panel may include a substrate; a light-emitting functional layer disposed on the substrate; a filtering layer disposed on a side of the light-emitting functional layer away from the substrate and including a plurality of filtering units, wherein at least one of the plurality of filtering units is designed to allow at least a portion of light from the light-emitting functional layer to diverge; and a plurality of light-converging elements disposed on a side of the filtering layer away from the substrate and configured to allow light from the plurality of filtering units to converge.

In some embodiments relating to the display panel, orthographic projections of the plurality of filtering units on the substrate may overlap with orthographic projections of the plurality of light-converging elements on the substrate, respectively.

In some embodiments relating to the display panel, the plurality of filtering units may include at least one first color filtering unit, at least one second color filtering unit, and at least one third color filtering unit, at least one of the first color filtering unit, the second color filtering unit, and the third color filtering unit may be designed to allow at least a portion of the light from the light-emitting functional layer to diverge.

In some embodiments relating to the display panel, only one of the first color filtering unit, the second color filtering unit, and the third color filtering unit may be designed to allow at least a portion of the light from the light-emitting functional layer to diverge.

In some embodiments relating to the display panel, two of the first color filtering unit, the second color filtering unit, and the third color filtering unit may be designed to allow at least a portion of the light from the light-emitting functional layer to diverge.

In some embodiments relating to the display panel, all of the first color filtering unit, the second color filtering unit and the third color filtering unit may be designed to allow at least a portion of the light from the light-emitting functional layer to diverge.

In some embodiments relating to the display panel, each of the plurality of filtering units may include a first face facing the light-emitting functional layer and a second face away from the light-emitting functional layer, and wherein at least one of the first face and the second face of at least one filtering unit designed to allow at least a portion of the light from the light-emitting functional layer to diverge may be a concave face.

In some embodiments relating to the display panel, the first face and the second face of the at least one filtering unit designed to allow at least a portion of the light from the light-emitting functional layer to diverge may be a planar face and a concave face, respectively, and wherein the first face and the second face of a remaining filtering unit other than the filtering unit designed to allow at least a portion of the light from the light-emitting functional layer to diverge may be planar faces.

In some embodiments relating to the display panel, the concave face may include a concave spherical face.

In some embodiments relating to the display panel, adjacent filtering units of the plurality of filtering units may have an overlay therebetween.

In some embodiments relating to the display panel, the light-converging element may include a light-converging lens or a light-converging prism.

In some embodiments relating to the display panel, the light-converging lens may be a plano-convex lens including a planar in-light surface facing the filtering layer and a curved out-light surface facing away from the filtering layer.

In some embodiments relating to the display panel, a radius of curvature of the concave spherical face may be greater than a radius of curvature of the curved out-light surface of the plano-convex lens.

In some embodiments relating to the display panel, the radius of curvature of the concave spherical face may be about 1.6-2.4 μm and the radius of curvature of the curved out-light surface of the plano-convex lens may be about 1.0-1.9 μm.

In some embodiments relating to the display panel, a refractive index difference between the media on two sides of the concave spherical surface is greater than a refractive index difference between the media on two sides of the curved out-light surface of the plano-convex lens.

In some embodiments relating to the display panel, the adjacent ones of the plurality of light converging elements may have a gap therebetween.

In some embodiments relating to the display panel, the display panel may further include a planarizing layer disposed between the filtering layer and the plurality of light-converging elements.

In some embodiments relating to the display panel, a refractive index of the filtering layer may be greater than a refractive index of the planarizing layer and a refractive index of the light converging element.

In some embodiments relating to the display panel, the refractive index of the filtering layer may be about 1.6-1.75; the refractive index of the light converging element may be about 1.56-1.60; and the refractive index of the planarizing layer may be about 1.44-1.55.

In some embodiments relating to the display panel, the display panel may further include a plurality of first electrodes and a second electrode insulated from each other and between the substrate and the filtering layer, wherein the second electrode may be disposed on a side of the plurality of first electrodes away from the substrate.

In some embodiments relating to the display panel, orthographic projections of the plurality of first electrodes on the substrate may partially overlap with orthographic projections of the plurality of light converging elements on the substrate, respectively, and a distance between a center of each first electrode and a center of the light-converging element whose orthographic projection partially overlaps with the orthographic projection of the respective first electrode may be greater than 0 in a direction parallel to the substrate.

Another aspect of the present disclosure provides a display device. The display device includes a display panel in accordance with any one of the embodiments described in detail in the present disclosure.

Yet another aspect of the present disclosure provides a method for preparing a display panel according to any one of the embodiments described in detail in the present disclosure. The method includes: providing a substrate; forming a light-emitting functional layer on the substrate; forming a filtering layer on the light-emitting functional layer, the filtering layer including a plurality of filtering units, wherein at least one of the plurality of filtering units is designed to allow at least a portion of light from the light-emitting functional layer to diverge; and forming a plurality of light converging elements on the filtering layer, the plurality of light converging elements being configured to allow the light from the plurality of filtering units to converge.

In embodiments relating to the method, forming a plurality of light converging elements on the filtering layer includes: forming a planarizing layer on the filtering layer; and forming a plurality of light converging elements on the planarizing layer.

Further aspects and areas of applicability will become apparent from the description provided herein. It should be understood that various aspects of this application may be implemented individually or in combination with one or more other aspects. It should also be understood that the description and specific examples herein are intended for purposes of illustration only and are not intended to limit the scope of the present application.

BRIEF DESCRIPTION OF THE DRAWINGS

The drawings described herein are for illustrative purposes only of selected embodiments and not all possible implementations, and are not intended to limit the scope of the present application, in which.

Corresponding reference numerals indicate corresponding parts or features throughout the several views of the drawings.

DETAILED DESCRIPTION

Figure 1A:
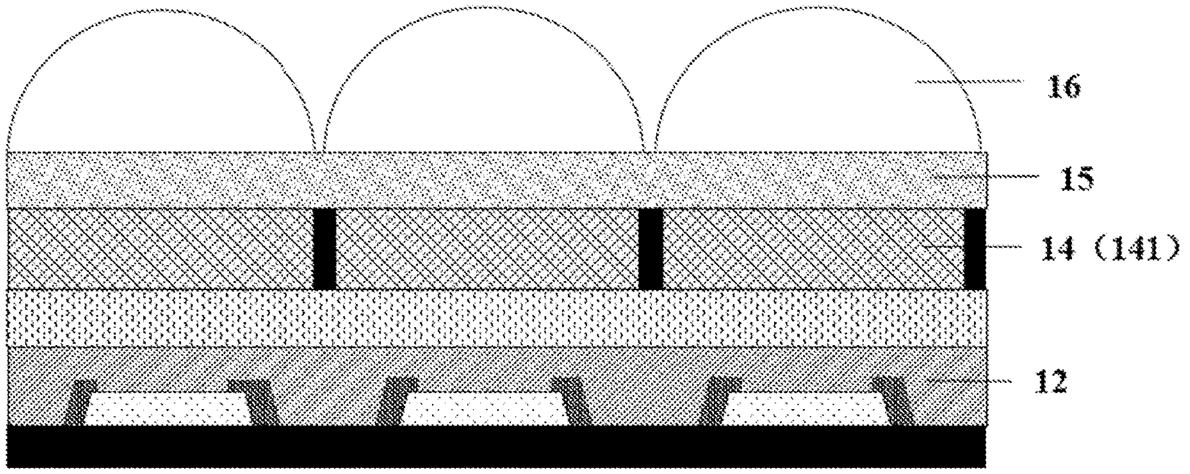
FIG. 1A schematically illustrates an example display panel with a plurality of lenses FIG. 1B schematically illustrates an optical path in the display panel of FIG. 1A.

Various embodiments, which are provided as exemplary examples of the present disclosure, will now be described in detail with reference to the accompanying drawings to enable those skilled in the art to implement the present disclosure.

It should be noted that the following accompanying drawings and examples are not meant to limit the scope of the present disclosure. Where particular elements of the present disclosure may be partially or fully implemented using known components (or methods or processes), only those parts of such known components (or methods or processes) that are necessary for an understanding of the present disclosure will be described, and the detailed descriptions of other parts of such known components will be omitted so as not to confuse the present disclosure. Further, various embodiments encompass present and future known equivalents to the components referred to herein by way of illustration.

As used herein and in the appended claims, the singular form of a word includes the plural, and vice versa, unless the context clearly dictates otherwise. Thus, when referring to the singular, it is generally inclusive of the plurals of the respective terms. Similarly, the terms "comprises", "includes", "contains" and "has" and their grammatical variants are intended to be inclusive and indicate that additional elements may be present in addition to those listed. Where the term "example" is used herein, particularly when it follows a group of terms, the "example" is merely exemplary and illustrative, and should not be deemed to be exclusive or comprehensive.

As used herein, the term "be located on" does not refer to a specific geometric orientation of the final stack in the display panel or the display device with respect to a direction of a gravitational force but rather indicates a way of manufacturing the stack, which, after manufacturing, could, in general, be placed in any geometric orientation, also such as turned upside down. The terms "first", "second", "third", etc. are used for descriptive purposes only and should not be construed to indicate or imply relative importance and order of formation.

As used throughout the text, the respective ranges are used in abbreviated form in order to avoid expanding and describing each value in the range in detail. When appropriate, any suitable value within the range may be selected as the higher value of the range, the lower value, or the end of the range.

An OLED display panel generally includes a substrate, a cathode, an anode, a hole injection layer (HIL), an electron injection layer (EIL), a hole transport layer (HTL), an electron transport layer (ETL), a light-emitting layer (EML), etc. When the OLED is under the action of electric field, holes generated by the anode and electrons generated by the cathode will move and inject into the hole transport layer and the electron transport layer, respectively, and then migrate to the light-emitting layer. When the they meet in the light-emitting layer, energy excitons are generated, which excites the light-emitting molecules to eventually produce visible light.

Brightness and viewing angle are important optical indicators to measure the performance of a display panel. In some technologies, in order to achieve higher brightness for displaying, some light-converging elements are generally used in the display panel to converge light emitted by the light-emitting layer toward the center of the respective pixel. This may increase the brightness of individual subpixels and thus improve the overall brightness of the display panel. In particular, in a miniature display panel, a plurality of micro-lenses may be used for individual subpixels to increase the brightness by the convergence of light by the micro-lenses.

Figure 1B:
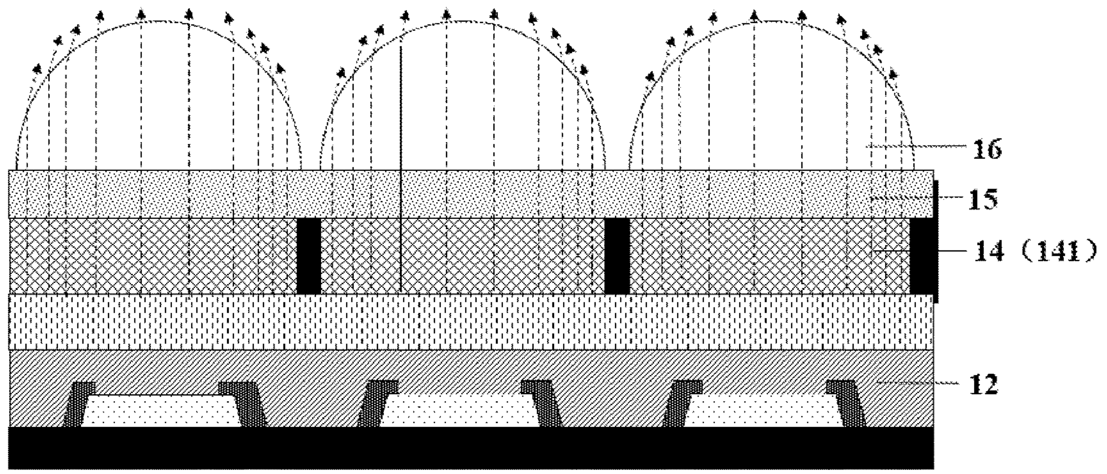

FIG. 1A schematically illustrates an example display panel with a plurality of lenses; FIG. 1B schematically illustrates an optical path in the display panel of FIG. 1A. Referring to FIG. 1A, a plurality of lenses 16 may be provided in the display panel. The plurality of lenses 16 may correspond to a plurality of subpixels of the display panel one by one. Specifically, the plurality of lenses 16 may correspond, one by one, to a plurality of filtering units 141 of the filtering layer 14 of the display panel. Referring to FIG. 1B, the light-emitting functional layer 12 of the display panel may be considered as a planar light source, and the light emitted from the light-emitting functional layer 12 is transmitted in a substantially vertical direction through the filtering layer 14. After passing through the filtering layer, the light is incident on a plurality of lenses 16 above the filtering layer 14. Each of the plurality of lenses 16 converges the light incident thereon toward the middle of the subpixel corresponding to the lens 16 to increase the brightness of the sub-pixel.

However, the convergence of light by the lenses 16 causes a reduction in the viewing angle of the display panel. This phenomenon is more evident in the miniature display panel with high viewing angle requirement.

In order to ensure the brightness of a display panel without significant loss of the viewing angle of the display panel, some embodiments of the present disclosure provide display panels that are capable of increasing the viewing angle by modifying the shape of the filtering unit of the filtering layer.

Herein, the term "subpixel" is a basic functional unit for displaying an image, which may include a pixel electrode, a portion of the common electrode facing the pixel electrode, a portion of the light-emitting functional layer between the pixel electrode and the corresponding portion of the common electrode, and a corresponding filtering unit (red, green, or blue). Thus, an individual filtering element is one of the components of a subpixel. However, for convenience, in some parts of this document, no strict distinction is made between the filtering unit and the subpixel, which may be used interchangeably.

An embodiment of the present disclosure provides a display panel that may include a substrate; a light-emitting functional layer disposed on the substrate; a filtering layer disposed on a side of the light-emitting functional layer away from the substrate and including a plurality of filtering units, wherein at least one of the plurality of filtering units is designed to allow at least a portion of light from the light-emitting functional layer to diverge; and a plurality of light-converging elements disposed on a side of the filtering layer away from the substrate and configured to allow light from the plurality of filtering units to converge.

In embodiments of the present disclosure, the filtering unit may sever as diverging element to allow the light from corresponding light-emitting element of the light-emitting functional layer to diverge, thereby increasing the viewing angle. The light diverged by the filtering unit is then converged by the light-converging element to increase the brightness of each subpixel. Typically, the light emitted from the light-emitting elements of the light-emitting function layer toward each subpixel has a high brightness and uniformity in the middle region, while the brightness and uniformity of the light in the edge region is usually poor. In embodiments of the present disclosure, by the combination of the filtering unit and the corresponding light-converging element, the light in the middle region emitted by each light-emitting element may be first diverged by the filtering unit and then converged by the light-converging element, so that the light in the middle region may be fully utilized, and facilitate to improve the display uniformity of the display panel. And for the light in the edge region emitted by each light-emitting element, after being diverged through the filtering element, it is either deflected to and absorbed by a light-absorbing element (for example, a black matrix) between adjacent filtering elements, or exits from a gap between adjacent subpixels at a large angle, which may improve the viewing angle.

The specific construction of the display panel in some embodiments of the present disclosure is described in detail below in conjunction with the accompanying FIGS. 2-6.

Figure 2:
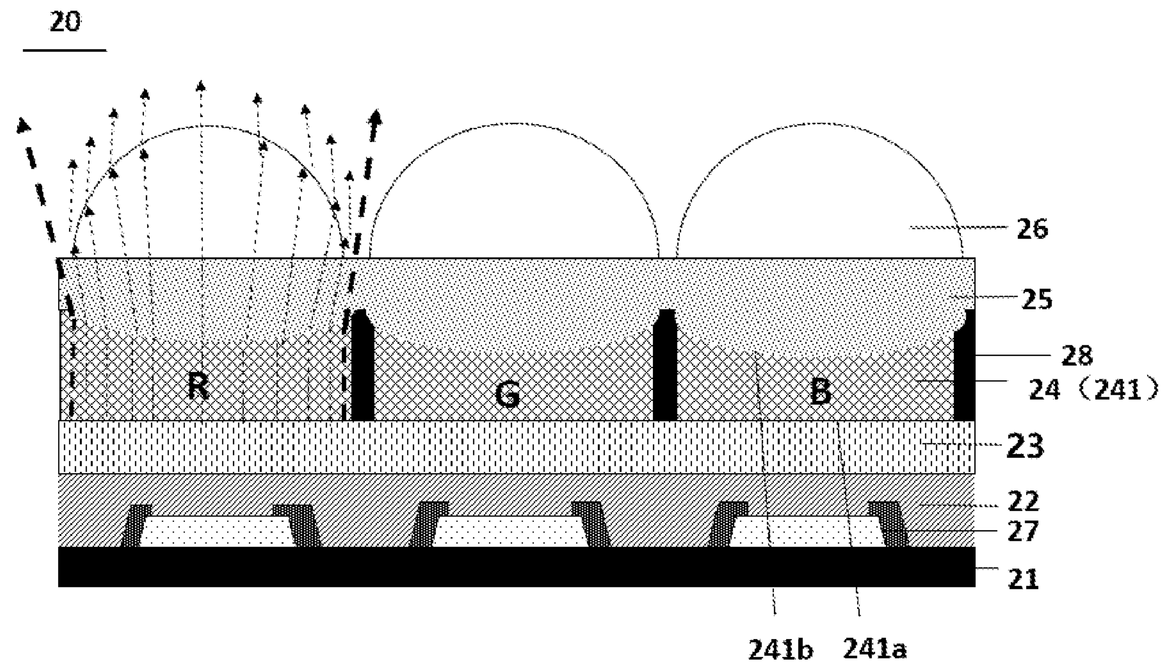
FIG. 2 schematically illustrates a display panel and a partial light path diagram thereof in one or more embodiments of the present disclosure.

FIG. 2 schematically illustrates a display panel 20 and a partial light path diagram thereof in one or more embodiments of the present disclosure. As shown in FIG. 2, the display panel 20 may include a substrate 21; a light-emitting functional layer 22 disposed on the substrate 21; a filtering layer 24 disposed on a side of the light-emitting functional layer 22 away from the substrate 21, wherein the filtering layer 24 may include a plurality of filtering units 241; and a plurality of light-converging elements 26 disposed on a side of the filtering layer 24 away from the substrate 21. Each of the filtering units 241 may be designed to allow at least a portion of light from the light-emitting function layer 24 to diverge. Each of the plurality of light-converging elements 26 may be configured to allow the light from the corresponding filtering unit 241 to converge.

In some embodiments of the present disclosure, the light-emitting functional layer 22 may include a plurality of light-emitting elements, and the orthographic projections of the plurality of light-emitting elements on the substrate may overlap with the orthographic projections of the plurality of filtering units 241 on the substrate, respectively. In one or more embodiments of the present disclosure, the orthographic projections of the plurality of filtering units 241 on the substrate 21 overlaps with the orthographic projections of the plurality of light-converging elements 26 on the substrate 21, respectively. That is, the plurality of filtering units 241 correspond to and overlap with, in the thickness direction of the display panel 20, the plurality of light-converging elements 26 one by one. In an alternative embodiment of the present disclosure, the orthographic projections of the plurality of light-emitting elements on the substrate, the orthographic projections of the plurality of filtering units 241 on the substrate, and the orthographic projections of the plurality of light-converging elements 26 on the substrate overlap.

It should be noted that in some embodiments of the present disclosure, "each of the filtering units 241 may be designed to allow at least a portion of light from the light-emitting functional layer 241 to diverge" means that each of the filtering units 241 may be designed to allow at least a portion of the light from the light-emitting element of the light-emitting functional layer 241 corresponding to each filtering unit to diverge. Herein, for the sake of brevity, at least a portion of the light from each light-emitting element of the light-emitting functional layer 241 corresponding to each filtering unit is collectively referred to light from the light-emitting functional layer 241.

Referring to FIG. 2, each filtering unit 241 may allow the light emitted by the corresponding light-emitting element of the light-emitting function layer 22 to diverge, which, on the one hand, increases the viewing angle of each subpixel, and on the other hand, and allows the light in the central region evenly dispersed over the subpixel to improve the brightness uniformity. And the light-converging element 26 may allow the light after being diverged by the filtering unit 241 to converge, thus increasing the overall brightness of the display panel 20. Thus, the display panel 20 provided by the embodiments of the present disclosure may achieve a large viewing angle without significantly loss of brightness.

In some embodiments of the present disclosure, the material of the substrate 21 may be a semiconductor material such as monocrystalline silicon or polycrystalline silicon. In an alternative embodiment, substrate 21 may also be made of other rigid or flexible materials such as glass, plastic, etc.

In some embodiments of the present disclosure, the light-emitting functional layer 22 may be a continuous film layer, and the light-emitting functional layer may include a plurality of light-emitting elements for the plurality of pixels defined by pixel definition openings of the pixel definition layer. The light-emitting functional layer 22 may include, for example, a hole injection layer, a hole transport layer, a light-emitting layer, an electron transport layer, and an electron injection layer sequentially laminated.

In some embodiments of the present disclosure, the plurality of light filtering units 241 may include at least one first color filtering unit, at least one second color filtering unit, and at least one third color filtering unit. As an example, the at least one first color filtering unit may include at least one red filtering unit R, the at least one second color filtering unit may include at least one green filtering unit G, and the at least one third color filtering unit may include at least one blue filtering unit B. As shown in FIG. 2, in some embodiments of the present disclosure, all of the plurality of filtering units 241 may be designed to allow at least a portion of the light from the light-emitting functional layer to diverge so that the viewing angle of each pixel may be expanded by the appropriate divergence of light by the corresponding filtering unit 241, thereby allowing the viewing angle of the entire display panel 20 to be expanded.

With continued reference to FIG. 2, each filtering unit 241 may include a first face 241*a* facing the light-emitting functional layer and a second face 241*b* facing away from the light-emitting functional layer. The second face 241*b* of each filtering unit 241 may be a concave face and the first side 241*a* is a planar face so that each filtering unit 241 may be sever as a flat-concave lens. In an example embodiment, the second face 241*b* of the filtering unit 241 may be a concave spherical surface, which may have a radius of curvature of 1.6 μm to 2.4 μm. Setting the second face 241*a* of each filtering unit 241 as a concave spherical surface facilitates process fabrication.

In an alternative embodiment, the first face 241*a* of the filtering unit 241 may be set as a concave face and the second face 241*b* of the filtering unit 241 may be set as a flat face. In another alternative embodiment, both the first face 241*a* and the second face 241*b* of the filtering unit 241 are set as concave surfaces recessed toward the interior of the corresponding filtering unit 241, such that the filtering unit 241 is severed as a biconcave lens. In an embodiment of the present disclosure, the filtering unit 241 having at least one concave face may also be referred to as a concave filtering unit, and the filtering unit in which both the first and second faces are planar may also be referred to as a planar filtering unit.

Figure 3:
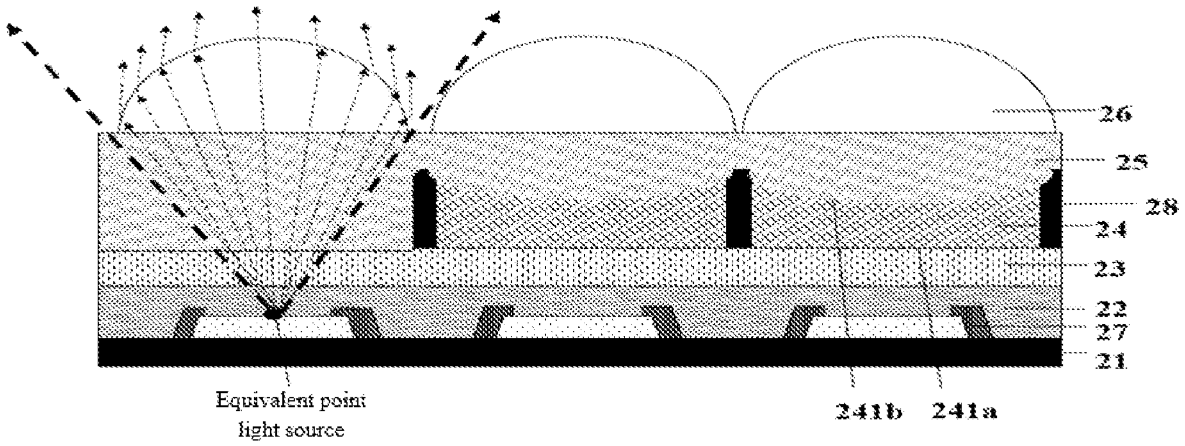
FIG. 3 schematically illustrates an equivalent light path in the display panel of FIG. 2 in one or more embodiments of the present disclosure.

In some embodiments of the present disclosure, the effect of the filtering unit 241 on the light from the light-emitting functional layer 22 may be equivalent to the effect of a point source to emit light. FIG. 3 schematically illustrates an equivalent light path of the display panel in FIG. 2 in one or more embodiments of the present disclosure. In FIG. 3, only the equivalent light path for one filtering unit 241 is illustrated. As shown in FIG. 3, the light diverged by the filtering unit 241 may be equivalent to the light emitted from a point light source located near the light-emitting functional layer 22. In the equivalent light path shown in FIG. 3, the filtering unit 241 may be equivalent to a point light source, and the light emitted from the equivalent point light source is directly incident on the light-converging element 26 and is converged by the light-converging element 26.

In some embodiments of the present disclosure, adjacent filtering units 241 of the plurality of filtering units 241 may have an overlay therebetween. By way of example, they may have an overlay of 0±0.6 μm. In an example embodiment, adjacent filtering units may be spaced apart by a black matrix 28 provided between adjacent filtering units 241 to prevent crosstalk of colors between adjacent pixels. In this case, adjacent filtering units 241 may not have an overlay or have a negative overlay therebetween (as in the case illustrated in FIG. 2), i.e., adjacent filtering units have a spacing therebetween, and the black matrix 28 may be located in the spacing. In the case where the black matrix 28 is provided between adjacent filtering units 241, each of the adjacent filtering units 241 may have an overlay with the black matrix 28, i.e., a portion of each filtering unit 241 may be overlapped on the corresponding black matrix 28, so as to prevent light leakage. For further preventing light leakage, the portions of adjacent filtering units 241 on the black matrix 28 may also have an overlay.

In a small size display panel (e.g., a miniature display panel), the size of the black matrix needs to be particularly small in order not to affect the opening ratio of the display panel, which however greatly increases the process difficulty. In an alternative embodiment, instead of setting the black matrix 28 between adjacent filtering units 241, different pixels may also be spaced apart by allowing adjacent filtering units 241 to overlap, thereby omitting the step of making the black matrix and thus simplifying the process.

In some embodiments of the present disclosure, the light-converging element 26 may be a light-converging lens. As shown in FIG. 2, the light-converging lens 26 may be a plano-convex lens including a planar in-light surface facing the filtering layer 24 and a curved out-light surface facing away from the filtering layer 24. In some embodiments of the present disclosure, a radius of curvature of the curved out-light surface of the plano-convex lens is less than a radius of curvature of the concave spherical surface of the filtering unit so that the light is substantially converged after sequentially passing through the light-converging lens 26 and the filtering unit 241. As an example, the radius of curvature of the curved out-light surface of the plano-convex lens may be about 1.0-1.9 μm. In an alternative embodiment, the light-converging element 26 may also be a biconvex lens.

In other embodiments of the present disclosure, the light-converging element 26 may also be a light-converging prism, such as a trigonal prism, a right angle prism, or an isosceles trapezoidal prism. It would be understood by those of skill in the art that the light-converging elements 26 for the display panel 20 of embodiments of the present disclosure may not be limited to those described in detail in embodiments of the present disclosure, and that any element or combination of elements that may have a converging effect on light may be applied to the present disclosure.

In some embodiments of the present disclosure, adjacent light-converging elements 26 of a plurality of light-converging elements 26 may have a gap therebetween to prevent adhesion between light-converging elements due to process errors during the manufacturing process. In an example embodiment, the gap between adjacent light-converging elements may be about 0.4-1.0 μm. This may prevent adjacent light-converging elements from being too close to cause adhesion to each other during the manufacturing process, and also may prevent light waste due to the gap being too large. It may be understood that the gap may be adjusted appropriately according to the actual condition for brightness gain and brightness viewing angle considerations.

In some embodiments of the present disclosure, after the light emitted from the light-emitting function layer is diverged by each filtering unit, the middle portion of the light is incident on and converged by the light-converging element to increase the luminance, while the edge portion of the light may not be incident on the light-converging element, but exit from the gap between adjacent light-converging elements, as shown by the thick dashed arrows in FIG. 2 and FIG. 3, so that the viewing angle range may be increased.

In some embodiments of the present disclosure, with continued reference to FIG. 2, the display panel 20 may also include a transistor array 27 including a plurality of transistors disposed on the substrate 21 and disposed between the substrate 21 and the light-emitting functional layer 22; an encapsulation layer 23 disposed between the filtering layer 24 and the light-emitting functional layer 22; and a planarizing layer 25 disposed between the filtering layer 24 and the plurality of light-converging elements 26.

The display panels 20 provided by embodiments of the present disclosure may also include other components as desired, such as, a first electrode (for example, anode, which may also be referred to as a pixel electrode), a second electrode (for example, cathode, which may also be referred to as a common electrode), a laminating adhesive disposed above the light-converging elements 26, and other desired components not shown in the accompanying drawings. The structure or configuration of these components may be in any configuration known in the prior art and is not specifically described in this disclosure.

In some embodiments of the present disclosure, a refractive index difference between the media (e.g., the planarizing layer and the filtering element) on two sides of the concave spherical surface of the filtering unit 241 is greater than a refractive index difference between the media (e.g., the plano-convex lens and the laminating adhesive 31) on two sides of the curved out-light surface of the light-converging element 26, such that the light is substantially converged light after passing sequentially through the light-converging lens 26 and the filtering unit 241.

In some embodiments of the present disclosure, the refractive index of the filtering layer 24 may be greater than the refractive indexes of the planarizing layer 25 and the light-converging element 26. As an example, the refractive index of the filtering layer 24 may be about 1.6-1.75, the refractive index of the light-converging element 26 may be about 1.56-1.60, and the refractive index of the planarizing layer 25 may be about 1.44-1.55.

Figure 4:
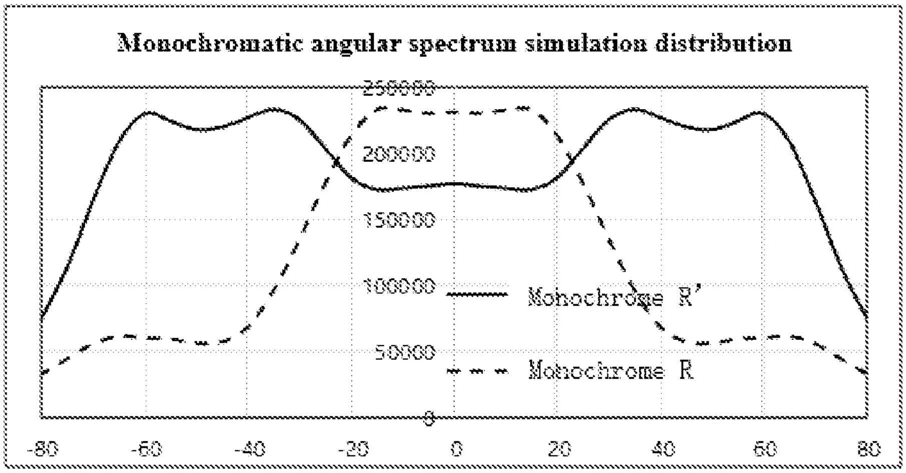
FIG. 4 schematically illustrates monochromatic view simulations of a concave filtering unit with a planar filtering unit in one or more embodiments of the present disclosure.

FIG. 4 schematically illustrates a monochromatic view simulation of a concave filtering unit and a planar filtering unit in one or more embodiments of the present disclosure. The simulation is performed for monochrome (e.g., red), and it is understood that a similar effect may be achieved for color (RGB) display panels. As shown in FIG. 4, the viewing angle range (marked by the dashed line) of the display panel with the planar filtering unit is only about −18° to +18°, while the viewing angle range (marked by the solid line) of the display panel with the concave filtering unit according to one or more embodiments of the present disclosure increases to about −60° to +60°. It can be seen that the viewing angle of the display panel with the concave filtering unit provided in the embodiments of the present disclosure is significantly improved without a significant decrease in brightness.

In silicon-based OLED display panels, particularly in VR/AR display panels, a user typically expects the display panel to have a specific lateral viewing angle range, i.e., a customized viewing angle range. For example, a user may expect a good display in the specific viewing angle range of ±40° to ±60° degrees. This purpose may also be achieved by the display panel with the concave filtering unit provided in an embodiment of the present disclosure. As shown in FIG. 4, the display panel with the concave filtering unit provided according to an embodiment of the present disclosure has greater brightness in the ranges of about −60° to −35° and +35° to +60°, so specific viewing angle ranges of about −60° to −35° and +35° to +60° may be achieved. In an alternative embodiment, the customization of other viewing angle ranges may be achieved by modifying configuration parameters of the components, for example, at least one of the radius of curvature of the concave spherical surface of the light filtering unit and the radius of curvature of the curved out-light surface of the light gathering element, of the display panel provided according to embodiments of the present disclosure.

In yet another alternative embodiment, an offset of the particular viewing angle range may be achieved by changing the relative positions of the components of the display panel provided according to embodiments of the present disclosure. As an example, the overall viewing angle of the display panel may be shifted to the right or to the left by shifting the pixel electrodes (i.e., first electrodes) of the display panel to the left or to the right relative to the light-converging element in a direction parallel to the substrate.

Figure 9:
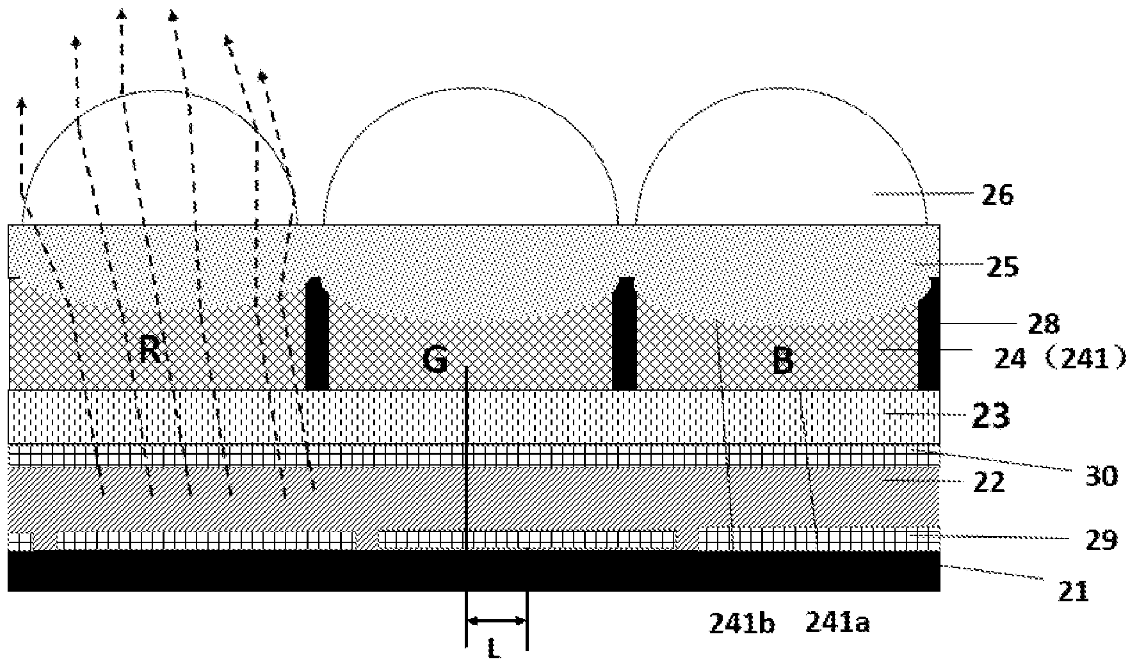
FIG. 9 schematically illustrates an arrangement of a display panel with an offset view-angle range and an optical path diagram thereof.

FIG. 9 schematically illustrates an arrangement of a display panel with an offset viewing angle range and an optical path diagram thereof. In the embodiment as shown in FIG. 9, a plurality of first electrodes 29 and a second electrode 30 are illustrated, wherein the second electrode 30 is located on a side of the first electrode 29 away from the substrate 21. As shown in FIG. 9, the orthographic projections of the plurality of first electrodes 29 on the substrate 21 may partially overlap with the orthographic projections of the plurality of light-converging elements 26 on the substrate. In this embodiment, a distance L between a center of each first electrode 29 and a center of the light-converging element 26 whose orthographic projection partially overlaps with the orthographic projection of the respective first electrode is greater than 0 in a direction parallel to the substrate. That is, the plurality of first electrodes 29 may be translated relative to the plurality of light-converging elements 26 in the direction parallel to the substrate 21, for example to the right. This corresponds to an overall leftward offset of the filtering unit 241 and the light-converging element 26 with respect to the corresponding first electrodes 29, such that the filtering unit 241 and the light-converging element 26 are offset to the left with respect to the corresponding light-emitting element of the light-emitting functional layer. The relative offset between the elements may cause the viewing angle of the display panel to deviate from the immediate front of the display panel, for example, shift to the left as shown in FIG. 9.

It may be understood that in the case that the filtering unit 241 and the light-converging element 26 shift to the right with respect to the first electrode 29, the viewing angle of the display panel also shift to the right.

For ease of illustration and in order not to cause confusion, the transistor array 27 illustrated in other embodiments of the present disclosure is not shown in FIG. 9, which does not mean that the embodiment shown in FIG. 9 does not include the transistor array 27. In fact, the transistor array 27 may be located between the first electrode 29 and the substrate 21 and the first electrode 29 may be connected to the transistors of the transistor array 27 through vias.

Figure 5:
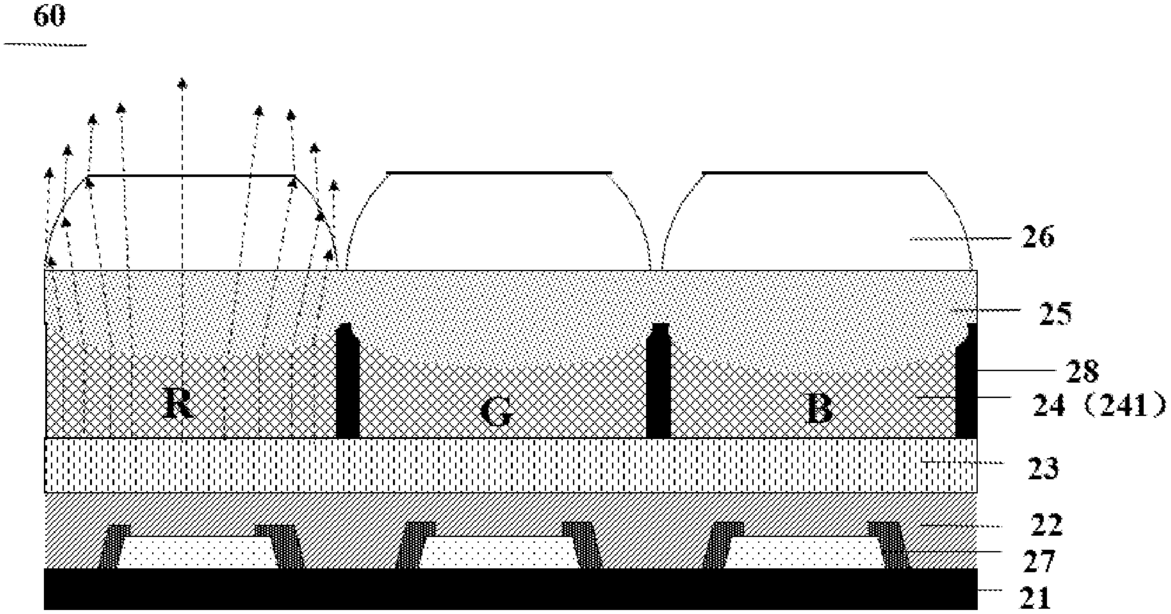
FIG. 5 schematically illustrates another display panel and a light path diagram thereof in one or more embodiments of the present disclosure.

FIG. 5 schematically illustrates another display panel 60 and an optical path diagram thereof in one or more embodiments of the present disclosure. The display panel 60 illustrated in FIG. 5 shares some similarities with the display panel 20 illustrated in FIG. 2, and the description provided with respect to FIG. 2 applies to the display panel 60 illustrated in FIG. 5, as appropriate. Accordingly, in the following description, only portions that differ from the embodiments shown in FIG. 2 are described, and portions that are identical to the embodiments shown in FIG. 2 are omitted.

Another display panel 60 shown in FIG. 5 differs from the display panel 20 shown in FIG. 2 in the structure of the light-converging element 26. As shown in FIG. 5, at least one of the plurality of light-converging elements 26 may be a lens (which may also be referred to as a flat-top lens) enclosed by a first plane facing the filtering layer 24, a second plane facing away from the filtering layer 24, and two curved surfaces connecting the first plane and the second plane. The two curved surfaces of this lens may converge the light incident thereon in a direction of the center of the second plane. In the embodiment shown in FIG. 5, the light from the light-emitting functional layer 22 may be diverged by the filtering element 241, and the edge portion of the diverged light may be then converged by the two curved surfaces of the flat-top lens toward the middle of the flat-top lens, so the edge portion of the light may be effectively utilized, and therefore the brightness of the display panel may be improved as well.

It shall be understood that although each of the plurality of light-converging elements shown in FIG. 5 is designed as a flat-top lens, it is also possible to designate some of the plurality of light-converging elements (e.g., light-converging elements corresponding to one or two of the red filtering unit, the green filtering unit, and the blue filtering unit) as flat-top light-converging elements and the remaining light-converging elements as plano-convex lenses or other types of lenses.

Figure 6:
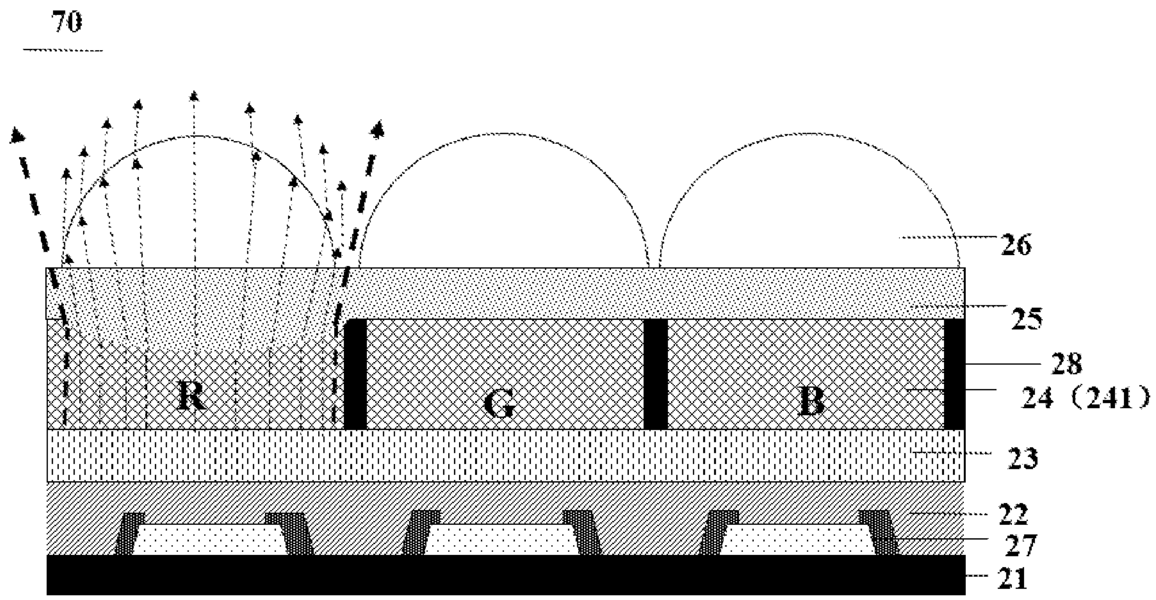
FIG. 6 schematically illustrates yet another display panel and a light path diagram thereof in one or more embodiments of the present disclosure.

FIG. 6 schematically illustrates yet another display panel 70 and a light path diagram thereof in one or more embodiments of the present disclosure. The display panel 70 illustrated in FIG. 6 shares some similarities with the display panel 20 illustrated in FIG. 2, and the description provided with respect to FIG. 2 applies to the display panel illustrated in FIG. 6, as appropriate. Accordingly, in the following description, only portions that differ from the embodiment shown in FIG. 2 are described, and portions that are identical to the embodiment shown in FIG. 2 are omitted.

As shown in FIG. 6, the plurality of filtering units 241 may include at least one first color filtering unit, at least one second color filtering unit, and at least one third color filtering unit. As an example, the at least one first color filtering unit may include at least one red filtering unit R, the at least one second color filtering unit may include at least one green filtering unit G, and the at least one third color filtering unit may include at least one blue filtering unit B. In the embodiment as shown in FIG. 6, one of the red filtering unit R, the green filtering unit G, and the blue filtering unit B may be designed to allow at least a portion of the light from the light-emitting functional layer 22 is diverge, so as to meet the needs of different users for different color shifts of the display panel.

As an example, for a user who expects the display panel to have an overall reddish hue, the upper surface of the red filtering unit R of the filtering layer 24 may be designed as a concave spherical surface, while the upper surfaces of the green filtering unit G and the blue filtering unit B may be flat. The concave red filtering unit R may allow the light incident thereon to diverge such that the edge portion of the diverged light (for example, the light entering the gap between adjacent light-converging elements 26) is deflected to the adjacent pixels, thereby causing the display panel to have an overall reddish hue. For a user who expects the display panel to have an overall greenish hue, the upper surface of the green filtering unit G of the filtering layer 24 may be designed as a concave spherical surface, while the upper surfaces of the red filtering unit R and the blue filtering unit B may be flat. The concave green filtering unit G may allow the light incident thereon to diverge such that the edge portion of the diverged light (for example, light entering the gap between adjacent light-converging elements 26) is deflected to the adjacent pixels, thereby causing the display panel to have an overall greenish hue. For a user who expects the display panel to have an overall bluish hue, the upper surface of the blue filtering unit B of the filtering layer 24 may be designed as a concave spherical surface, while the upper surfaces of the green filtering unit G and the red filtering unit R may be flat. The concave blue filtering unit B may allow the light incident thereon to diverge such that the edge portion of the diverged light (for example, the light entering the gap between adjacent light-converging elements 26) is deflected to the adjacent pixels, thereby causing the display panel to have an overall bluish hue.

It shall be understood that in some embodiments of the present disclosure, two of the red filtering unit R, the green filtering unit G, and the blue filtering unit B may also be designed to allow at least a portion of the light from the light-emitting functional layer to diverge, so as to achieve the user's need for color adjustment of the display panel.

Figure 10:
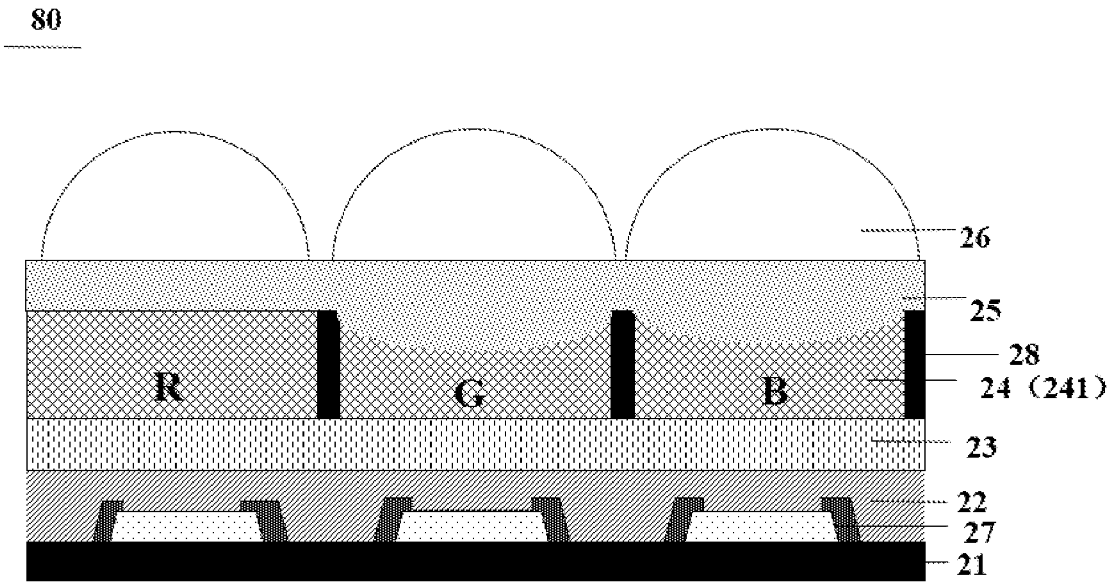
FIG. 10 schematically illustrates still another display panel and an optical path diagram thereof in one or more embodiments of the present disclosure.

FIG. 10 schematically illustrates still another display panel 80 and a light path diagram thereof in one or more embodiments of the present disclosure. The display panel 80 illustrated in FIG. 10 shares some similarities with the display panel 20 illustrated in FIG. 2, and the description provided with respect to FIG. 2 applies to the display panel illustrated in FIG. 10, as appropriate. Accordingly, in the following description, only portions that differ from the embodiments illustrated in FIG. 2 are described, and portions that are identical to the embodiments illustrated in FIG. 2 are omitted.

As shown in FIG. 10, the plurality of light filtering units 241 may include at least one red filtering unit R, at least one green filtering unit G, and at least one blue filtering unit B. In the embodiment shown in FIG. 10, two of the red filtering unit R, the green filtering unit G, and the blue filtering unit B may be designed to allow at least a portion of the light from the light-emitting functional layer 22 to diverge, so as to meet the needs of different users for different color shifts of the display panel.

Display panels, in particular silicon-based display panels, often suffer from color shift, especially when viewed at a large viewing angle. For example, the display panel is reddish. In some embodiments of the present disclosure, in order to improve the reddish phenomenon of the display panel, the upper surfaces of the green filtering unit G and the blue filtering unit B may be designed as concave spherical surfaces, i.e., the green filtering unit G and the blue filtering unit B are designed as concave filtering units, while the red filtering unit R is designed as a flat filtering unit. This configuration may improve the reddish phenomenon of the display panel by increasing the viewing angle of the green filtering unit G and the blue filtering unit B.

In an alternative embodiment, in the context of a display panel with green color shift, the red filtering unit R and blue filtering unit B may be designed as concave filtering units, while the green filtering unit G may be designed as a flat filtering unit. This configuration may improve the greenish phenomenon of the display panel by increasing the viewing angle of the red filtering unit R and the blue filtering unit B.

In yet another alternative embodiment, in the context of a display panel with blue color shift, the red filtering unit R and the green filtering unit G may be designed as concave filtering units, while the blue filtering unit B may be designed as a flat filtering unit. This configuration may improve the bluish phenomenon of the display panel by increasing the viewing angle of the red filtering unit R and the green filtering unit G.

Figure 7:
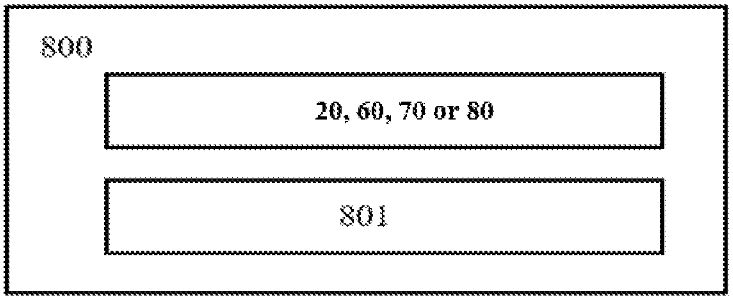
FIG. 7 schematically illustrates a display device in one or more embodiments of the present disclosure.

In another aspect of the present disclosure, a display device is further disclosed, which may include a display panel according to the present disclosure, such as the display panel of one or more embodiments disclosed in detail above. Thus, for optional embodiments of the display device, reference may be made to embodiments of the display panel. FIG. 7 schematically illustrates a display device 800 in one or more embodiments of the present disclosure. As shown in FIG. 7, the display device 800 may include a display panel 20, 60, 70, or 80 of one or more embodiments disclosed in detail herein. The display device 800 may further include a drive circuit 801 for providing drive signals for driving the display panel.

In yet another aspect of the present disclosure, a method for preparing a display panel is further disclosed. The method may prepare at least one display panel according to the present disclosure, such as at least one display panel according to one or more of the embodiments disclosed in detail above. Thus, for optional embodiments of the method, reference may be made to embodiments of the display panel. The method may include the following steps, which may be performed in a given order or in a different order. In addition, additional method steps not listed may be provided. In addition, two or more or even all of the method steps may be performed at least partially simultaneously. In addition, the method steps may be repeatedly performed twice or even more than twice.

Figure 8:
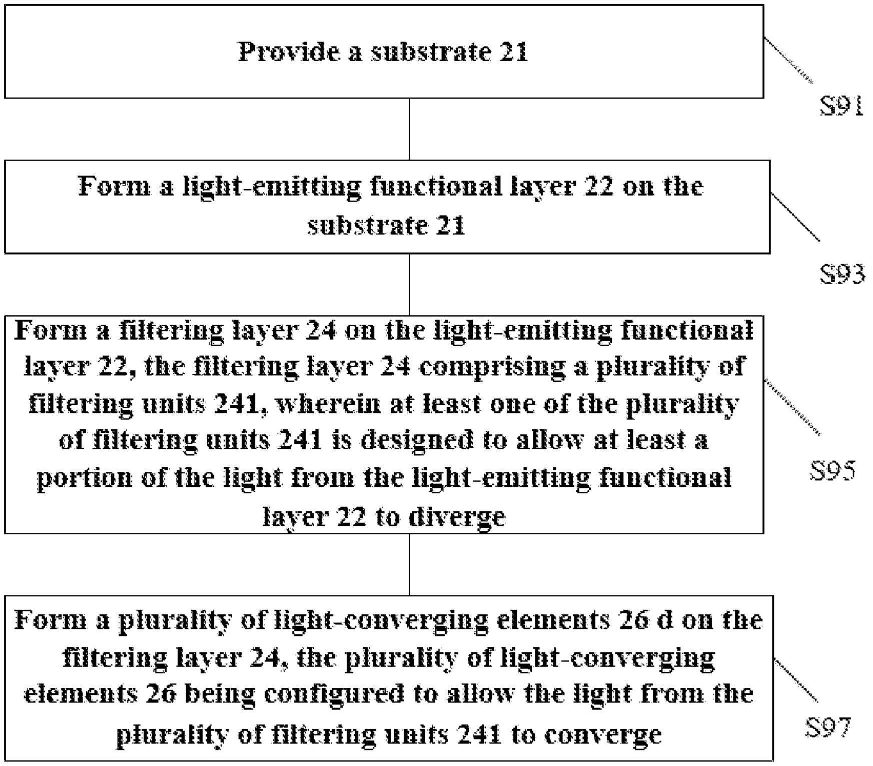
FIG. 8 schematically illustrates a flowchart of a method for preparing a display panel in one or more embodiments of the present disclosure.

FIG. 8 schematically illustrates a flow chart of a method for preparing a display panel in one or more embodiments of the present disclosure. As shown in FIG. 8, the method may include steps S91, S93, S95, S97.

At step S91, a substrate 21 is provided. The material of the substrate 21 may be a semiconductor material such as monocrystalline silicon or polycrystalline silicon. In alternative embodiments, the substrate 21 may also be made of other rigid or flexible materials such as glass, plastic, etc.

At step S93, a light-emitting functional layer 22 is formed on the substrate 21. The light-emitting functional layer 22 may include a hole injection layer, a hole transport layer, a light-emitting layer, an electron transport layer, and an electron injection layer sequentially laminated.

At step S95, a filtering layer 24 is formed on the light-emitting functional layer 22, the filtering layer 24 including a plurality of filtering units 241, wherein at least one of the plurality of filtering units 241 is designed to allow at least a portion of the light from the light-emitting functional layer 22 to diverge. In an example embodiment, each filtering unit 241 may include a first face facing the light-emitting functional layer 22 and a second face facing away from the light-emitting functional layer 22, wherein the second face of each filtering unit 241 is provided as a concave face to allow the light from the light-emitting functional layer 22 to diverge. In an alternative embodiment, the second faces of some of the plurality of filtering units 241 (e.g., the same color filtering unit) may be concave, while the second faces of the remaining filtering units 241 may be flat, to achieve the effect of different color shifts of the display panel.

At step S97, a plurality of light-converging elements 26 are formed on the filtering layer 24, the plurality of light-converging elements 26 being configured to allow the light from the plurality of filtering units 241 to converge. In this step, since at least some of the surfaces of the filtering units 241 of the filtering layer 24 are concave, it is beneficial to first form a planarizing layer 25 on the filtering layer 24 and then form the plurality of light-converging elements 26 on the planarizing layer 25.

The foregoing description of the embodiment has been provided for purpose of illustration and description. It is not intended to be exhaustive or to limit the application. Individual elements or features of a particular embodiment are generally not limited to that particular embodiment, but, where applicable, are interchangeable and may be used in a selected embodiment, even if not specifically shown or described. The same may also be varied in many ways. Such variations are not to be regarded as a departure from the application, and all such modifications are included within the scope of the application.

There are various refinements of the noted features related to the above aspects of the present disclosure. Further features may also be incorporated into the above-described aspects of the present disclosure. These refinements and additional features may exist individually or in any combination. For example, the various features discussed above in connection with any illustrative embodiment of the present disclosure may be incorporated into any of the foregoing aspects of the present disclosure, either alone or in any combination.

The invention claimed is:

1. A display panel comprising:

a substrate;

a light-emitting functional layer disposed on the substrate;

a filtering layer disposed on a side of the light-emitting functional layer opposite the substrate and comprising a plurality of filtering units, wherein at least one of the plurality of light filtering units comprises a first face facing the light-emitting functional layer and a second face facing opposite the light-emitting functional layer, and wherein at least one of the first face and the second face is a concave face configured to allow at least a portion of light from the light-emitting functional layer to diverge; and a plurality of light-converging elements disposed on a side of the filtering layer opposite the substrate, wherein each of the plurality of light-converging elements comprises a light-converging lens or a light-converging prism configured to allow light from the plurality of filtering units to converge, wherein adjacent filtering units of the plurality of filtering units have an overlay therebetween.

2. The display panel according to claim 1, wherein orthographic projections of the plurality of filtering units on the substrate overlap with orthographic projections of the plurality of light-converging elements on the substrate, respectively.

3. The display panel according to claim 2, wherein the plurality of filtering units comprises at least one first color filtering unit, at least one second color filtering unit, and at least one third color filtering unit, and wherein at least one of the first color filtering unit, the second color filtering unit, and the third color filtering unit is designed to allow at least a portion of the light from the light-emitting functional layer to diverge.

4. The display panel according to claim 1, wherein the first face is a planar face and the second face is a concave face, and wherein the first face and the second face of a remaining filtering unit other than the filtering unit configured to allow at least a portion of the light from the light-emitting functional layer to diverge are planar faces.

5. The display panel according to claim 4, wherein the concave face comprises a concave spherical face.

6. The display panel according to claim 1, wherein the light-converging lens is a plano-convex lens comprising a planar in-light surface facing the filtering layer and a curved out-light surface facing opposite the filtering layer.

7. The display panel according to claim 6, wherein a radius of curvature of the concave spherical face is greater than a radius of curvature of the curved out-light surface of the plano-convex lens.

8. The display panel according to claim 7, wherein the radius of curvature of the concave spherical face is 1.6-2.4 μm and the radius of curvature of the curved out-light surface of the plano-convex lens is 1.0-1.9 μm.

9. The display panel according to claim 6, wherein a refractive index difference between the media on two sides of the concave spherical face is greater than a refractive index difference between the media on two sides of the curved out-light surface of the plano-convex lens.

10. The display panel according to claim 1, wherein adjacent light-converging elements of the plurality of light-converging elements have a gap therebetween.

11. The display panel according to claim 9, further comprising:

a planarizing layer disposed between the filtering layer and the plurality of light-converging elements.

12. The display panel according to claim 11, wherein a refractive index of the filtering layer is greater than a refractive index of the planarizing layer and a refractive index of the light-converging element.

13. The display panel according to claim 1, further comprising a plurality of first electrodes and a second electrode insulated from each other and between the substrate and the filtering layer, wherein the second electrodes are disposed on a side of the plurality of first electrodes opposite the substrate.

14. The display panel according to claim 13, wherein orthographic projections of the plurality of first electrodes on the substrate partially overlap with orthographic projections of the plurality of light-converging elements on the substrate, respectively, and wherein a distance between a center of each first electrode and a center of the light-converging element whose orthographic projection partially overlaps with the orthographic projection of the respective first electrode is greater than 0 in a direction parallel to the substrate.

15. A display device comprising a display panel of claim 1.

16. A method for preparing a display panel of claim 1, comprising:

providing a substrate;

forming a light-emitting functional layer on the substrate;

forming a filtering layer on the light-emitting functional layer, the filtering layer comprising a plurality of filtering units, wherein at least one of the plurality of filtering units comprises a first face facing the light-emitting functional layer and a second face facing opposite the light-emitting functional layer, and wherein at least one of the first face and the second face is a concave face configured to allow at least a portion of light from the light-emitting functional layer to diverge; and forming a plurality of light-converging elements on the filtering layer, wherein each of the plurality of light-converging elements comprises a light-converging lens or a light-converging prism configured to allow light from the plurality of filtering units to converge.

17. The method according to claim 16, wherein forming a plurality of light-converging elements on the filtering layer comprises:

forming a planarizing layer on the filtering layer; and forming a plurality of light-converging elements on the planarizing layer.

* * * * *